(12) United States Patent
Oh et al.

(10) Patent No.: US 7,485,490 B2
(45) Date of Patent: Feb. 3, 2009

(54) METHOD OF FORMING A STACKED SEMICONDUCTOR PACKAGE

(75) Inventors: Kwang Seok Oh, Seoul (KR); Jong Wook Park, Seoul (KR); Young Kuk Park, Seoul (KR); Byoung Youl Min, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 83 days.

(21) Appl. No.: 11/286,970

(22) Filed: Nov. 22, 2005

(65) Prior Publication Data

US 2006/0071315 A1    Apr. 6, 2006

Related U.S. Application Data

(62) Division of application No. 10/015,374, filed on Dec. 12, 2001, now abandoned.

(30) Foreign Application Priority Data

Mar. 9, 2001    (KR) ................... 2001-12326

(51) Int. Cl.
  *H01L 21/44* (2006.01)
  *H01L 21/48* (2006.01)
  *H01L 21/50* (2006.01)
(52) U.S. Cl. ............... 438/106; 438/109; 438/666
(58) Field of Classification Search ........... 438/106, 438/109, 107, 110, 121, 617, 612, 666; 257/777
See application file for complete search history.

(56) References Cited

U.S. PATENT DOCUMENTS

| 4,763,188 A | 8/1988 | Johnson | 357/74 |
| 5,012,323 A | 4/1991 | Farnworth | 357/75 |
| 5,025,306 A | 6/1991 | Johnson et al. | 357/75 |
| 5,291,061 A | 3/1994 | Ball | 257/686 |
| 5,323,060 A | 6/1994 | Fogal et al. | 257/777 |
| 5,347,429 A | 9/1994 | Kohno et al. | 361/813 |

(Continued)

FOREIGN PATENT DOCUMENTS

EP    0 503 201    12/1991

(Continued)

*Primary Examiner*—Chuong A. Luu
(74) *Attorney, Agent, or Firm*—Gunnison, McKay & Hodgson, L.L.P.; Serge J. Hodgson

(57) ABSTRACT

Disclosed is a stacking structure of semiconductor chips and semiconductor package using it, capable of achieving an electric insulation even if a conductive wire makes contact with a lower surface of an upper semiconductor chip, while reducing a total thickness thereof and preventing damage. The stacking structure has a substrate formed with a plurality of circuit patterns; a first semiconductor chip bonded to an upper surface of the substrate and having a first plane and a second plane formed with a plurality of input/output pads; a spacer bonded to the second plane of the first semiconductor chip; a second semiconductor chip having first and second planes, the second plane being formed with a plurality of input/output pads, the first plane being provided with an insulating member so as to allow the second semiconductor chip to be bonded to the spacer, a first conductive wire for connecting the input/output pads of the first semiconductor chip to the circuit patterns of the substrate; and a second conductive wire for connecting the input/output pads of the second semiconductor chip to the circuit patterns of the substrate.

19 Claims, 13 Drawing Sheets

U.S. PATENT DOCUMENTS

| | | | | |
|---|---|---|---|---|
| 5,422,435 A * | 6/1995 | Takiar et al. | | 174/521 |
| 5,463,253 A | 10/1995 | Waki et al. | | 257/724 |
| 5,495,398 A | 2/1996 | Takiar et al. | | 361/790 |
| 5,502,289 A | 3/1996 | Takiar et al. | | 174/266 |
| 5,689,135 A | 11/1997 | Ball | | 257/676 |
| 5,696,031 A | 12/1997 | Wark | | 437/209 |
| 5,715,147 A | 2/1998 | Nagano | | 361/813 |
| 5,721,452 A | 2/1998 | Fogal et al. | | 257/685 |
| 5,739,581 A | 4/1998 | Chillara et al. | | 257/668 |
| 5,815,372 A | 9/1998 | Gallas | | 361/760 |
| 5,866,949 A | 2/1999 | Schueller | | 257/778 |
| 5,886,412 A | 3/1999 | Fogal et al. | | 257/777 |
| 5,952,725 A | 9/1999 | Ball | | 257/777 |
| 5,973,403 A | 10/1999 | Wark | | 257/777 |
| 6,005,778 A * | 12/1999 | Spielberger et al. | | 361/770 |
| 6,013,948 A | 1/2000 | Akram et al. | | 257/698 |
| RE36,613 E | 3/2000 | Ball | | 257/777 |
| 6,051,886 A | 4/2000 | Fogal et al. | | 257/777 |
| 6,057,598 A | 5/2000 | Payne et al. | | 257/723 |
| 6,072,243 A | 6/2000 | Nakanishi | | 257/783 |
| 6,080,264 A | 6/2000 | Ball | | 156/292 |
| 6,118,176 A | 9/2000 | Tao et al. | | 257/676 |
| 6,133,637 A | 10/2000 | Hikita et al. | | 257/777 |
| 6,140,149 A | 10/2000 | Wark | | 438/105 |
| 6,157,080 A | 12/2000 | Tamaki et al. | | 257/738 |
| 6,163,076 A | 12/2000 | Lee et al. | | 257/777 |
| 6,214,641 B1 | 4/2001 | Akram | | 438/107 |
| 6,215,193 B1 | 4/2001 | Tao et al. | | 257/777 |
| 6,252,305 B1 | 6/2001 | Lin et al. | | 257/777 |
| 6,258,626 B1 | 7/2001 | Wang et al. | | 438/107 |
| 6,316,838 B1 | 11/2001 | Ozawa et al. | | 257/778 |
| 6,326,696 B1 | 12/2001 | Horton et al. | | 257/777 |
| 6,333,562 B1 | 12/2001 | Lin | | 257/777 |
| 6,340,846 B1 | 1/2002 | LoBianco et al. | | 257/783 |
| 6,359,340 B1 | 3/2002 | Lin et al. | | 257/777 |
| 6,365,966 B1 | 4/2002 | Chen et al. | | 257/723 |
| 6,387,728 B1 | 5/2002 | Pai et al. | | 438/106 |
| 6,388,313 B1 | 5/2002 | Lee et al. | | 257/686 |
| 6,437,449 B1 * | 8/2002 | Foster | | 257/777 |
| 6,461,897 B2 | 10/2002 | Lin et al. | | 438/107 |
| 6,476,475 B1 | 11/2002 | Lee | | 257/686 |
| 6,503,776 B2 | 1/2003 | Pai et al. | | 438/106 |
| 6,531,784 B1 | 3/2003 | Shim et al. | | 257/777 |
| 6,552,416 B1 | 4/2003 | Foster | | 257/666 |
| 6,603,072 B1 | 8/2003 | Foster et al. | | 174/52.4 |
| 2001/0023994 A1 | 9/2001 | Oka | | 257/782 |
| 2002/0014689 A1 | 2/2002 | Lo et al. | | 257/686 |
| 2002/0030262 A1 | 3/2002 | Akram | | 257/686 |
| 2002/0030263 A1 | 3/2002 | Akram | | 257/686 |
| 2002/0064905 A1 | 5/2002 | Park et al. | | 438/109 |
| 2002/0096755 A1 | 7/2002 | Fukui et al. | | 257/686 |
| 2002/0171136 A1 | 11/2002 | Hiraoka et al. | | 257/684 |
| 2002/0195624 A1 | 12/2002 | Glenn et al. | | 257/200 |
| 2003/0001252 A1 | 1/2003 | Ku et al. | | 257/686 |
| 2003/0038355 A1 | 2/2003 | Derderian | | 257/686 |
| 2003/0038356 A1 | 2/2003 | Derderian | | 257/686 |
| 2003/0137042 A1 | 7/2003 | Mess et al. | | 257/686 |
| 2003/0189259 A1 | 10/2003 | Kurita et al. | | 257/777 |
| 2003/0199118 A1 | 10/2003 | Park et al. | | 438/106 |
| 2004/0041249 A1 | 3/2004 | Tsai et al. | | 257/686 |
| 2004/0126926 A1 | 7/2004 | Arai et al. | | 438/107 |
| 2004/0169285 A1 | 9/2004 | Verma et al. | | 257/777 |
| 2004/0200885 A1 | 10/2004 | Derderian | | 228/180.5 |
| 2004/0241907 A1 | 12/2004 | Higashino et al. | | 438/109 |

FOREIGN PATENT DOCUMENTS

| | | |
|---|---|---|
| JP | 56-062351 | 5/1981 |
| JP | 60-182731 | 9/1985 |
| JP | 61-117858 | 6/1986 |
| JP | 62-008534 | 1/1987 |
| JP | 62-126661 | 6/1987 |
| JP | 63-128736 | 6/1988 |
| JP | 63-244654 | 10/1988 |
| JP | 64-001269 | 1/1989 |
| JP | 64-028856 | 1/1989 |
| JP | 64-071162 | 3/1989 |
| JP | 01-099248 | 4/1989 |
| JP | 03-165550 | 7/1991 |
| JP | 03-169062 | 7/1991 |
| JP | 04-028260 | 1/1992 |
| JP | 04-056262 | 2/1992 |
| JP | 04-096358 | 3/1992 |
| JP | 04-116859 | 4/1992 |
| JP | 05-013665 | 1/1993 |
| JP | 05-075015 | 3/1993 |
| JP | 05-109975 | 4/1993 |
| JP | 05-136323 | 6/1993 |
| JP | 10-256470 | 9/1998 |
| JP | 2001-308262 | 11/2001 |
| JP | 2002-093992 | 3/2002 |

* cited by examiner

METHOD OF FORMING A STACKED SEMICONDUCTOR PACKAGE

This application is a divisional of U.S. Pat. application Ser. No. 10/015,374, filed on Dec. 12, 2001, now abandoned which is herein incorporated by reference in its entirety.

FIELD OF THE INVENTION

The present invention relates to semiconductor chips, and more particularly, to a stacking structure of semiconductor chips- and a semiconductor package using it in which a conductive wire can be electrically insulated while a conductive wire is contacted with a lower surface of an upper semiconductor chip thereby preventing mechanical damage of the wire, and also diminishing a total thickness of the stacking structure.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die vertically in an IC package. Stacking multiple die will maximize function and efficiency of the semiconductor package.

In order to stack multiple die vertically in an IC package, an adhesive layer is required between the vertically stacked die. However, presently stacked IC packages require an extraordinarily thick adhesive layer between each die. The thick adhesive layer is necessary in order to prevent the conductive wire of the lower die from contacting the bottom surface of the upper die thereby preventing an electrical short. Unfortunately, the thickness of the adhesive layer limits the number of die that may be vertically stacked in the IC package.

Therefore, a need existed to provide a device and method to overcome the above problem.

SUMMARY OF THE INVENTION

A semiconductor package and a method of producing the same has a substrate. A first semiconductor chip is coupled to a surface of the substrate. The first semiconductor chip has a first and second surfaces which are substantially flat in nature. An adhesive layer is coupled to the second surface of the first semiconductor chip. A second semiconductor chip having first and second surfaces which are substantially flat in nature is further provided. An insulator is coupled to the first surface of the second semiconductor chip for preventing shorting of wirebonds. The second semiconductor chip is coupled to the adhesive layer by the insulator coupled to the first surface thereof.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
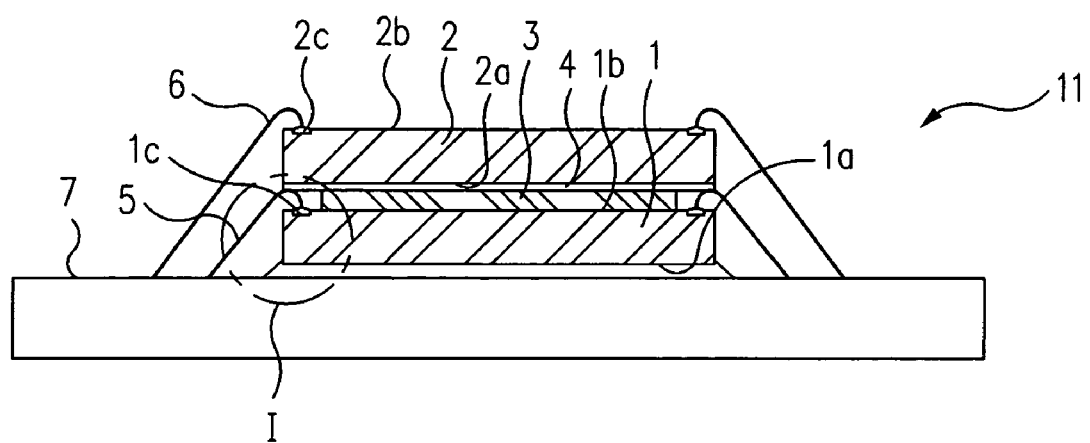
FIG. 1 illustrates a sectional view of one embodiment of the present invention.

Referring to FIG. 1, a sectional view of one embodiment of the present invention is shown. FIG. 1 illustrates a stacking structure 11 of a semiconductor chip wherein a substrate 7 having a substantially plate form, is provided. As is generally known, a printed circuit board, a circuit tape, a circuit film, a lead frame or the like may be used as the substrate 7. This is only a matter of selection by a person skilled in the art, and, therefore, this does not adversely influence the present invention.

As shown in FIG. 1, a first semiconductor chip 1 is bonded on a top surface of the substrate 7. The semiconductor chip 1 includes a first surface 1a and a second surface 1b, which are substantially flat in nature. A plurality of input-output pads 1c are formed on the second surface 1b of the first semiconductor chip 1.

There is an edge pad type semiconductor chip 1 in which a plurality of input-output pads 1c are formed at the inner circumference of the second surface 1b. A center pad type semiconductor chip will be described with reference to FIG. 4 hereafter.

An adhesive layer 3 having a predetermined thickness is bonded on the inside of the second surface 1b of the first semiconductor chip 1, excluding the input-output pads 1c. The adhesive layer 3 may include such substances as a nonconductive liquid phase adhesive, a nonconductive adhesive tape or other substances that are commonly known in the art for semiconductor chip attachment.

The adhesive layer 3 serves as an adhesive bonding to the second semiconductor chip 2 on the second surface 1b of the first semiconductor chip 1. Here, it is possible for the adhesive layer 3 to be formed in the same thickness as a loop height of a first conductive wires 5 mentioned below or a smaller thickness than the loop height. However, when the thickness of the adhesive layer 3 is thinner than the loop height, it is desirable that the thickness of the adhesive layer 3 is to be more than about 80% of the loop height. This will be described in detail hereafter.

Continuously, the input-output pads 1c of the first semiconductor chip 1 and the substrate 7 can be bonded to each other by the first conductive wires 5, such as gold or copper or aluminum wires or by its equivalent. This is performed by a conventional normal wire bonding manner which will be described hereafter. It should be noted that the listing of the different types of wires is just used as an example and should not be seen as to limit the scope of the present invention.

Continuously, a second semiconductor chip 2 having a first surface 2a and a second surface 2b, which are substantially flat in nature, is placed on the upper part of the adhesive layer 3. A plurality of input-output pads 2c are formed on the second surface 2b of the second semiconductor chip 2.

An insulator 4 is formed on the first surface 2a of the second semiconductor chip 2. That is, the insulator 4 formed on the first surface 2a of the second semiconductor chip 2 is bonded on the upper part of the adhesive layer 3.

The insulator 4 may include such substances as a liquid phase adhesive, an adhesive tape/film, a polyimide, an oxide layer and a nitride layer or other substances that are commonly known in the art for semiconductor chip or package. It is desirable that all these insulators have a nonconductive, soft, and elastic nature. Also, it is desirable that the thickness of the insulator 4 may be more than about 20% of the loop height of the first conductive wires 5.

The insulator 4, but not limited to, is formed in a wafer state before separating into individual semiconductor chips. That is, the insulator 4 can be formed by bonding the nonconductive tape/film on the back surface of the wafer, or by coating the nonconductive liquid phase adhesive or the polyimide on the back surface of the wafer in a spin coating or in a spray manner. Also, the insulator 4 can be formed by evaporating a relatively thicker oxide layer or nitride layer on the back surface of the wafer.

After forming the nonconductive tape/film, nonconductive liquid phase adhesive, polyimide, oxide layer or nitride layer (insulator) on the back surface of the wafer, a plurality of semiconductor chips are separated from the wafer, respectively.

Alternatively, insulator 4 may be formed at the individual semiconductor chip which is already separated from the wafer. Namely, after the semiconductor chip is separated from the wafer, the insulator 4 is formed at back surface of the semiconductor chip as described above.

As mentioned above, after forming insulator 4 on the first surface 2a of the second semiconductor chip 2, the second chip 2 is compressed and adhered to the upper part of adhesive layer 4.

At this time, since thickness of the adhesive layer 3 may be about the same or thinner than the loop height of the first conductive wires 5, the first conductive wires 5 may be contacted with the insulator 4 formed at the first surface 2a of the second semiconductor chip 2. However, the loop height portion of the first conductive wires 5 exposed outward from adhesive layer 3 is about 20% of total loop height in the first conductive wires 5. And thickness of the insulator 4 is more than 20% of the total loop height of the first conductive wires 5. Thus, the first conductive wires 5 do not directly contact to the first surface 2a of the second semiconductor chip 2.

Even in the case that the loop height portion of the first conductive wires 5 become exposed outward from adhesive layer 3, the first conductive wires 5 do not directly contact to the first surface 2a of the second semiconductor chip 2 by the insulator 4. Also, since the insulator 4 has a nonconductive, soft, and elastic nature, the first conductive wires 5 have no electrical or mechanical damages. Namely, the first conductive wires 5 can be easily overlapped or superimposed with the insulator 4 and the conductive wires 5 can be independent in the insulator 4. Thus, the first conductive wires 5 do not short each other and aren't heavily damaged by the insulator 4. The tape/film as the insulator 4 seems to have the most soft and elastic nature among the insulator mentioned above.

An edge pad type semiconductor chip 2, in which a plurality of input-output pads 2c is formed at the inner circumference of the second surface 2b, is illustrated in the FIG. 1.

However, a center pad type semiconductor chip 2, in which a plurality of input-output pads 2c is formed at the center of the second surface 2b, can also be used.

Continuously, the input-output pads 2c of the second semiconductor chip 2 and the substrate 7 can be bonded to each other by the second conductive wires 6, as described above or its equivalent.

Figure 1A:
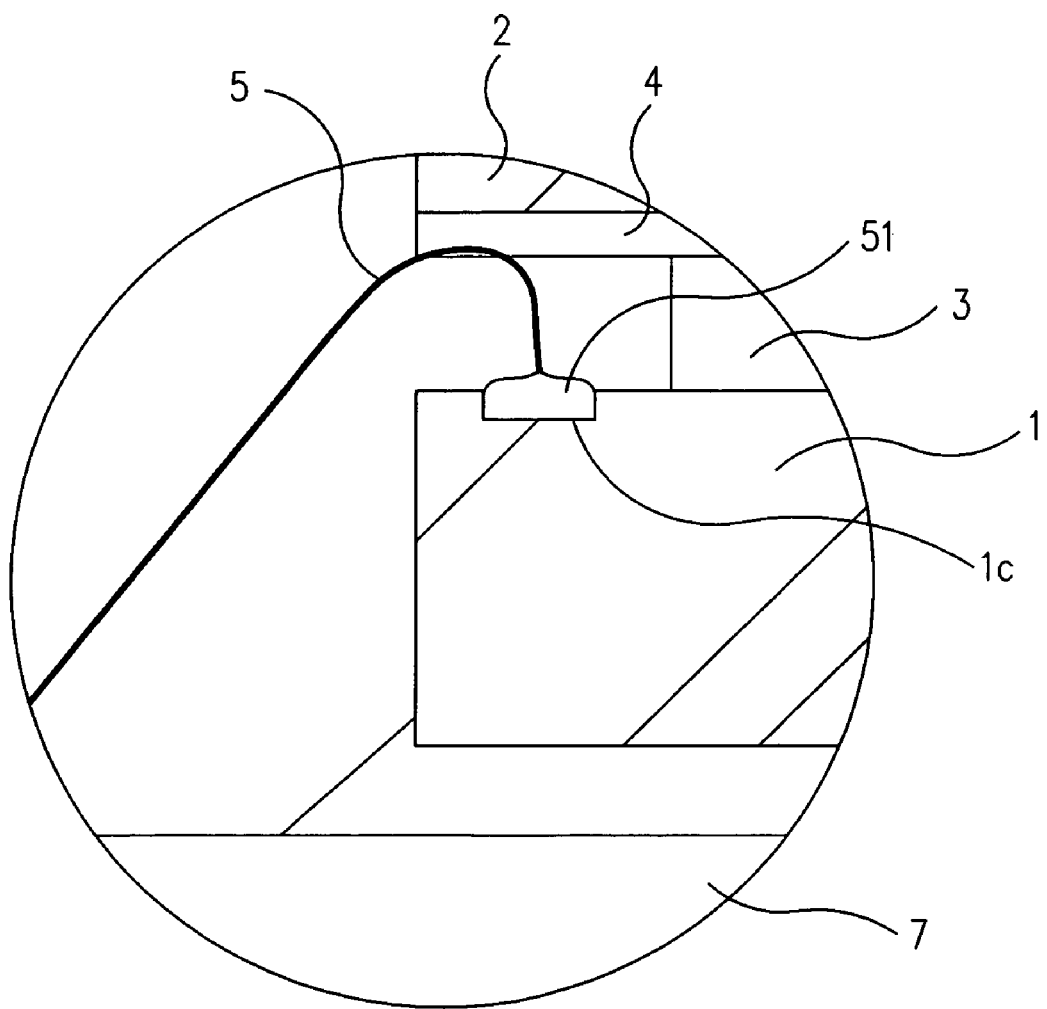
FIGS. 1A and 1B are magnified views of circle I as shown in FIG. 1.
Figure 1B:
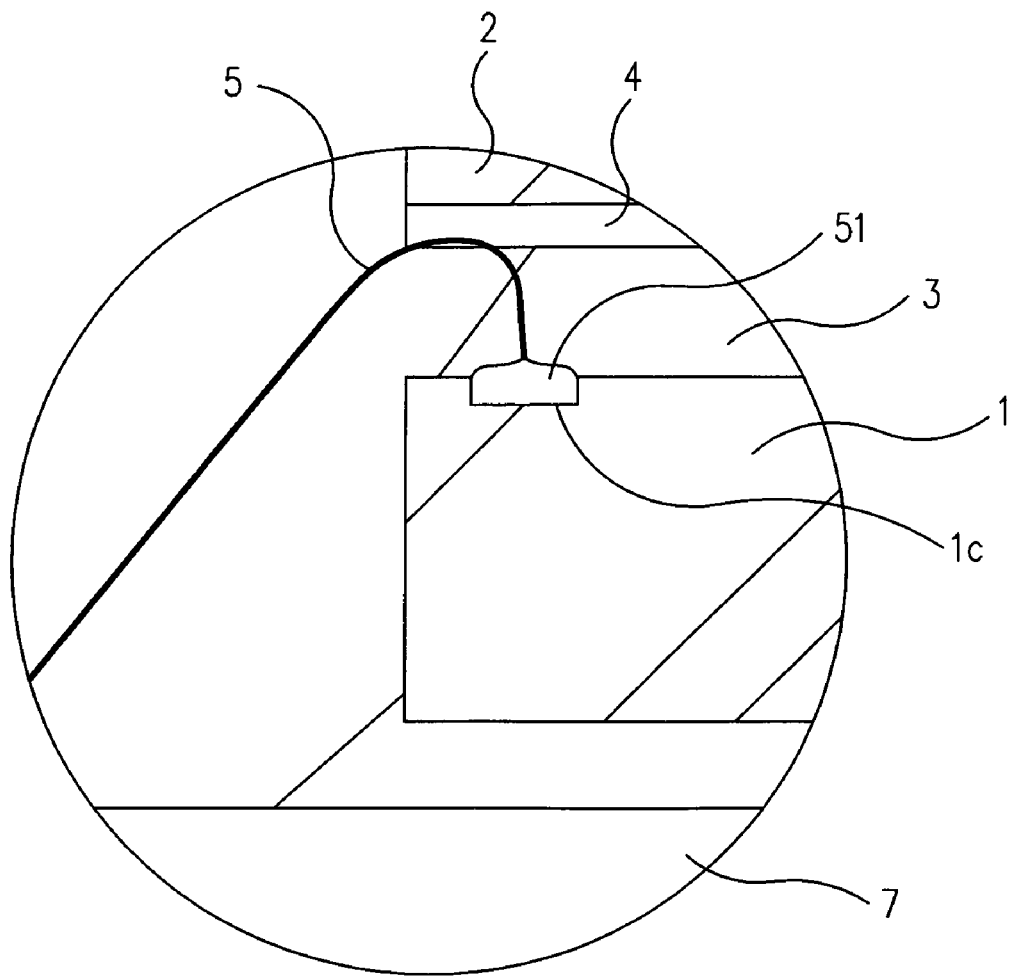

As shown in FIGS. 1A and 1B, which is a magnified view of circle I as shown in FIG. 1, the above conventional normal wire bonding is constructed in such a manner that an end of the conductive wire 5 is bonded on the input-output pad 1c of the semiconductor chip 1 by conductive ball 51 (ball bonding). Then the other end of the conductive wire 5 is bonded on the substrate 7 by stitch bonding.

As shown in FIG. 1A, if the adhesive layer 3 does not cover the input-output pads 1c, the wire bonding can be performed selectively before or after formation of the adhesive layer 3.

However, as shown in FIG. 1B, if adhesive layer 3 covers the input-output pads 1c, then the wire bonding must be performed before forming the adhesive layer 3. Here, if the adhesive layer 3 covers the input-output pads 1c of the semiconductor chip 1, the nonconductive liquid phase adhesive as adhesive layer 3 is generally used. That is, the adhesive tape as adhesive layer 3 may affect damages in the first conductive wires 5.

According to the stacking structure 11 of the present invention, the first conductive wires 5 are not directly contacted with the first surface 2a of the semiconductor chip 2. Thus, the phenomenon of an electrical short will not occur. Furthermore, mechanical damage of the first conductive wires 5 can also be prevented. Though the first conductive wires 5 are contacted with the insulator 4, electrical or mechanical damage has never occurred. That is, because of a nonconductive, soft and elastic nature of insulator 4, the first conductive wires 5 can be easily overlapped or superimposed with the insulator 4 and the conductive wires 5 can be independent in the insulator 4. Thus, the first conductive wires 5 do not short each other and aren't heavily damaged by the insulator 4.

Also, the thickness of the adhesive layer 3 can adequately become thinner. Namely, in prior art, the adhesive layer 3 should be formed in substantially twice the thickness of the loop height of the first conductive wires 5. However, in the present the invention, the adhesive layer 3 can be formed in the same thickness as the loop height of the first conductive wires 5 or a thickness that is less than the loop height. Thus, this invention can diminish a total thickness of the stacking structure of the semiconductor chips.

Figure 2:
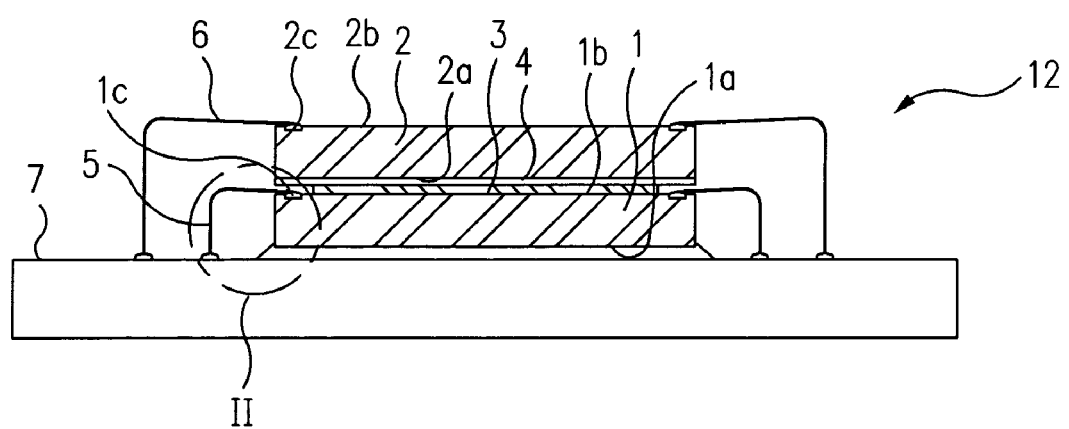
FIG. 2 illustrates a sectional view of another embodiment of the present invention.
Figure 2A:
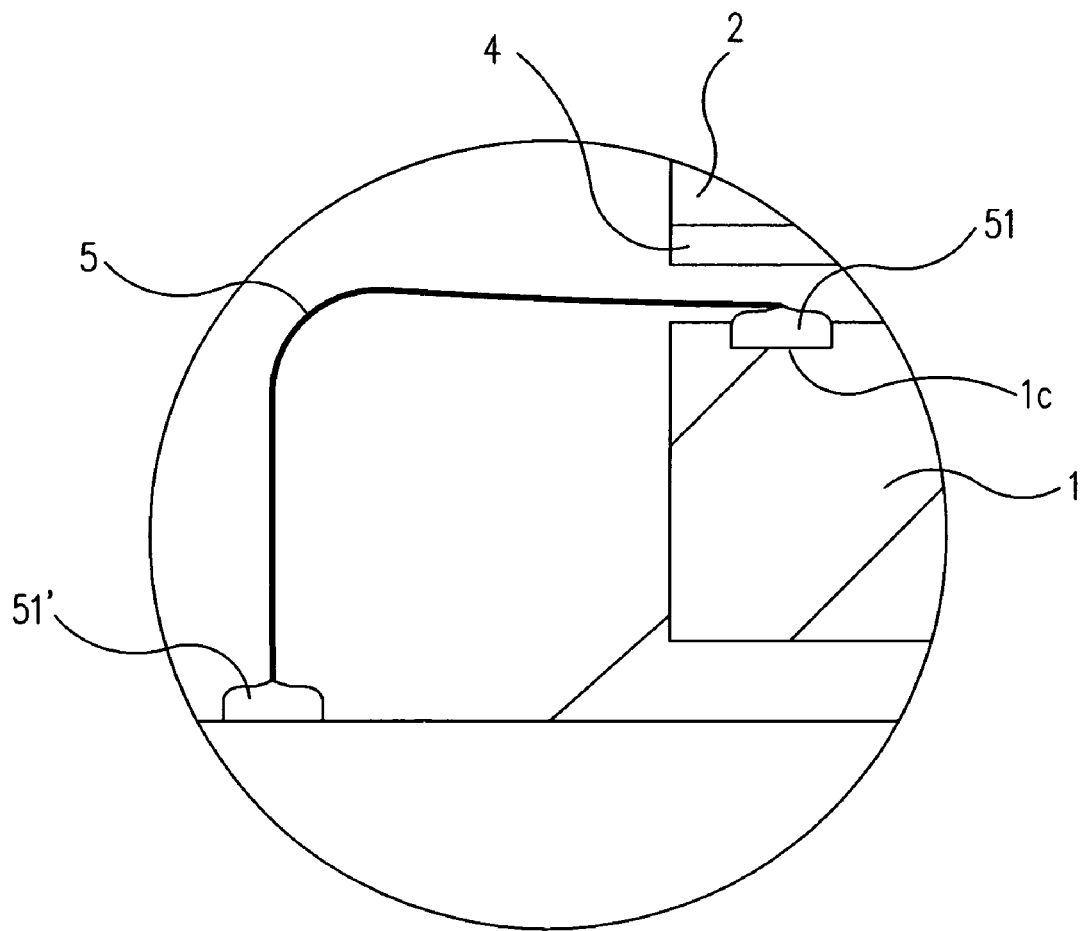
FIGS. 2A and 2B are magnified views of circle II as shown in FIG. 2.
Figure 2B:
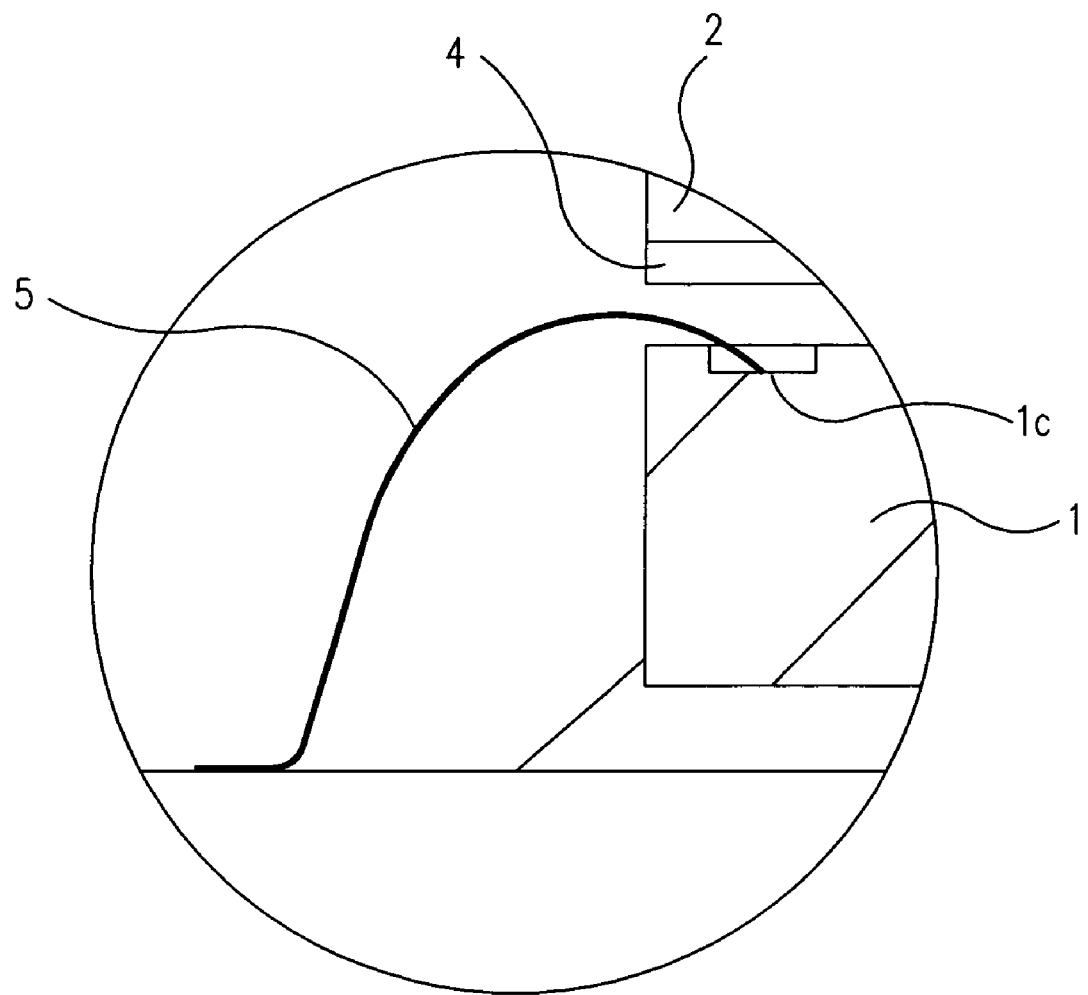

Referring to FIG. 2, a sectional view of another embodiment of the present invention is illustrated. Referring also to FIGS. 2A and 2B, magnified views of circle II shown in FIG. 2 are also illustrated. Since a stacking structure 12 illustrated in FIG. 2 is constructed in a similar manner to the stacking structure of FIG. 1, only differences existing there between will be described herein below.

As shown in FIG. 2 or FIG. 2A, the first and the second conductive wires 5 and 6 are not formed from a conventional normal bonding manner. Instead, a reverse bonding manner is used. Namely, the conventional normal bonding is constructed in such a manner that an end of the conductive wire is bonded on the input-output pad of the semiconductor chip by ball bonding. The other end of the conductive wire is then bonded on the substrate by stitch bonding.

Meanwhile, the reverse bonding is constructed in such a manner that an end of the conductive wire 5 is bonded on the substrate by conductive ball 51' (ball bonding). Then the other end of the conductive wire 5 is bonded on the input-output pad 1c of the semiconductor chip 1 by stitch bonding. Of course, a conductive ball 51 is formed on the input-output pads of semiconductor chip 1 by the conductive wire 5 in advance in order to alleviate an impulse created by the stitch bonding. The reverse bonding can be applied to all the first and second conductive wires 5 and 6 by which the first semiconductor chip 1 and the second semiconductor chip 2 are connected to the substrate 7, respectively.

In the case where the reverse bonding is used, the thickness of the adhesive layer 3 can be thinner owing to a lower loop height of the first conductive wires 5. That is, as the loop height of the conductive wire 5, which is bonded by the stitch bonding, is very low, the thickness of the adhesive layer 3 can be reduced sharply.

Also, since the loop height of the conductive wires 5 is low, when the second semiconductor chip 2 is adhered or compressed to the adhesive layer 3, the first conductive wires 5 have less mechanical stress than the first embodiment. Thus, the first conductive wires 5 can not create an electrical short or mechanical damage.

In certain cases, the insulator 4 having elevated bonding power can be used as bonding materials without using the adhesive layer 3. Nevertheless, since the insulator 4 has the nonconductive, soft and elastic nature, the first conductive wires can not create an electrical short or mechanical damage.

Of course, the adhesive layer 3 may cover the input-output pads 1c of the first semiconductor chip 1 (not shown) and the second conductive wires 6 may connect between the input-output pads 2c and the substrate 7 by normal bonding.

Further, as shown in FIG. 2B, a wedge bonding manner can be applied to the first and the second conductive wires 5 and 6 in order to lower the loop height. That is, the wedge bonding is constructed in such a manner that an end of the conductive wire is bonded on the input-output pad of the semiconductor chip by stitch bonding. Then, the other end of the conductive wire is bonded on the substrate by stitch bonding.

Similarly, in the case where the wedge bonding is used, the thickness of the adhesive layer 3 can be thinner owing to a lower loop height of the first conductive wires 5. That is, as the loop height of the conductive wire, which is bonded by the stitch bonding, is very low, the thickness of the adhesive layer 3 can be reduced sharply.

Also, since the loop height of the conductive wires 5 is low, when the second semiconductor chip 2 is adhered or compressed to the adhesive layer 3, the first conductive wires 5 have less mechanical stress than the first embodiment.

Figure 3:
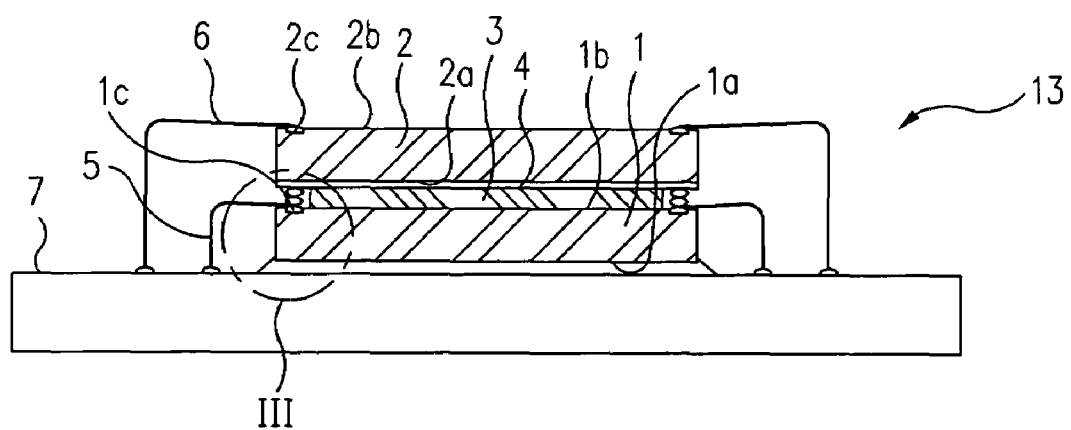
FIG. 3 illustrates a sectional view of another embodiment of the present invention.
Figure 3A:
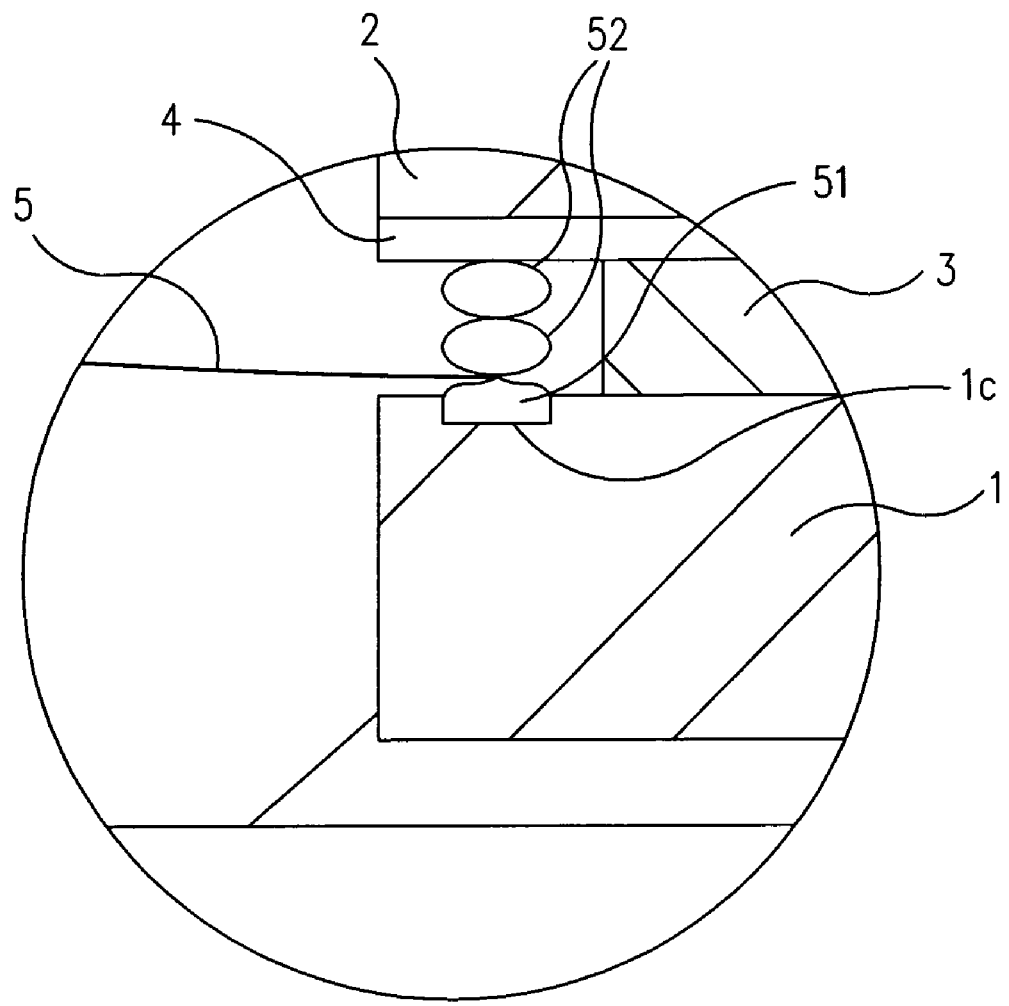
FIGS. 3A and 3B are magnified views of circle III as shown in FIG. 3.

Referring to FIG. 3, a sectional view of another embodiment of the present invention is illustrated. Also referring to FIGS. 3A and 3B, magnified views of circle III as shown in FIG. 3 are illustrated. Since a stacking structure 13 is constructed in a similar manner to the stacking structure 12 of FIG. 2, only differences existing there between will be described herein below. As shown in FIGS. 3 and 3A, the first and the second conductive wires 5 and 6 are formed by a reverse bonding manner. The conductive ball 51 is formed on the input-output pads 1c and 2c of the semiconductor chip 1 and 2 by the conductive wire in advance in order to alleviate an impulse created by the stitch bonding.

Furthermore, a supporter 52 is formed on the upper part of the conductive wires 5 connected with input-output pads 1c of the semiconductor chip 1. Namely, the supporter 52 is formed on the upper part of the conductive balls 51 and the first conductive wires 5 together. Also, the supporter 52 may be formed on the outside of the input-output pads 1c. For example, a plurality of the supporters 52 can be formed on the inner circumference of the second surface 1b of the semiconductor chip 1.

The supporter 52 may be formed after wire bonding. Namely, first of all, the conductive ball 51 is formed on the input-output pads 1c, and the first conductive wire 5 is bonded to the conductive ball 51. At last, the supporter 52 is formed on the first conductive wire 5 superimposed over the conductive ball 51.

The supporter 52 may be formed by conventional stud bump forming manner. For example, a ball is formed at end of a conductive wire, and the ball is fused to the top of the first conductive wire 5. The conductive wire is then cut off except the ball. Furthermore, another ball is formed at the end of the conductive wire, and this ball is bonded to the fused ball above mentioned. As for a repetition of this manner, as shown in FIG. 3A, a raw type conductive ball forms the supporter 52.

The supporter 52 may include such substances as gold, silver, copper, and solder or other substances that are commonly known in the art for the semiconductor chip. The above listing of substances should not be seen as to limit the scope of the present invention.

Meanwhile, the supporter 52 is contacted with the bottom of the insulator 4 formed on the second semiconductor chip 2 so as to support the second semiconductor chip 2. Thus, since the supporter 52 supports many portions of the insulator 4 formed on the semiconductor chip 2, the semiconductor chip 2 will be supported more stable. Of course, the adhesive layer 3 may cover the input-output pads 1c of the first semiconductor chip 1 and the supporter 52.

Figure 3B:
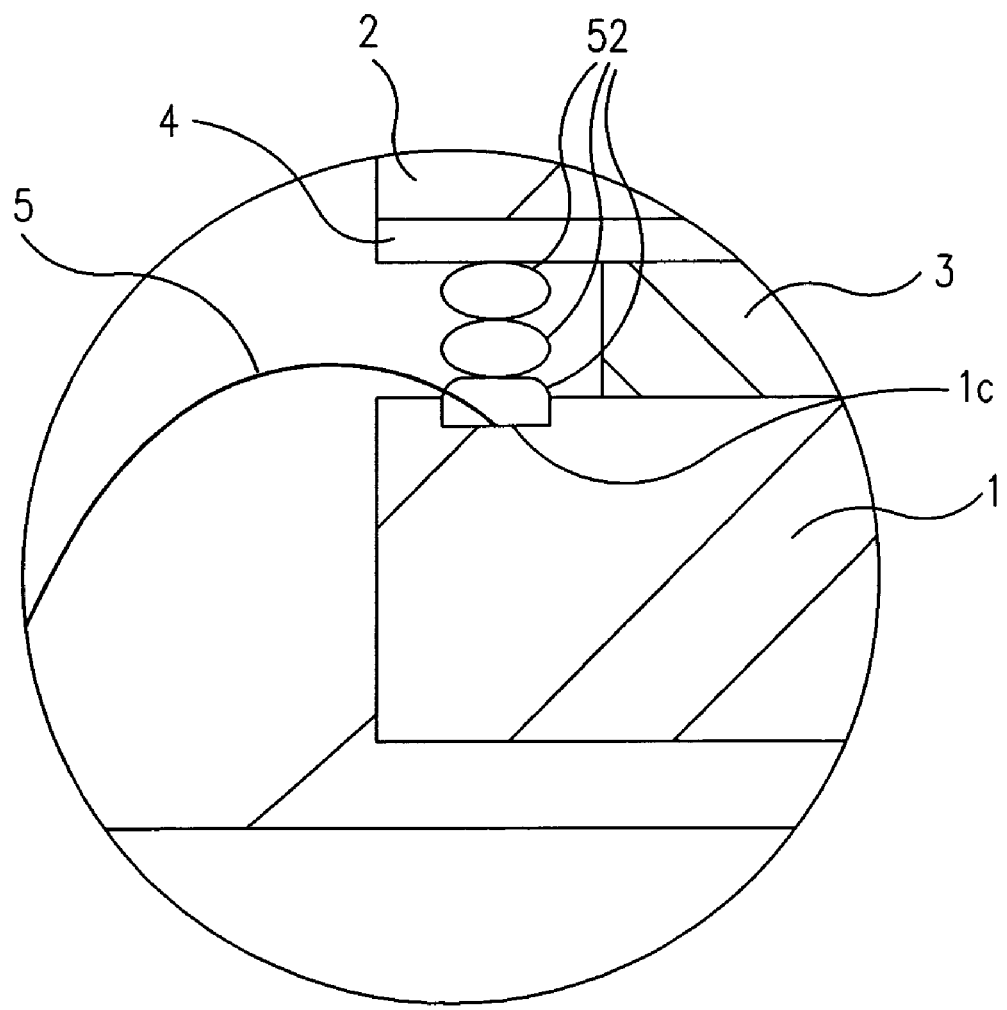

Further, as shown in FIG. 3B, a wedge bonding manner can be applied to the first and the second conductive wires 5 and 6 in order to lower the loop height.

Similarly, the supporter 52 is formed on the upper part of the conductive wires 5 connected with input-output pads 1c of the semiconductor chip 1. The supporter 52 is contacted with the insulator 4 so as to support the second semiconductor chip 2. Thus, since the supporter 52 supports the insulator 4 formed on the semiconductor chip 2, the semiconductor chip 2 becomes more stable.

Also, since the conductive wires 5 is covered with supporter 52, when the second semiconductor chip 2 is adhered or compressed to the adhesive layer 3, the first conductive wires 5 have less mechanical stress than the previous embodiments.

Figure 4:
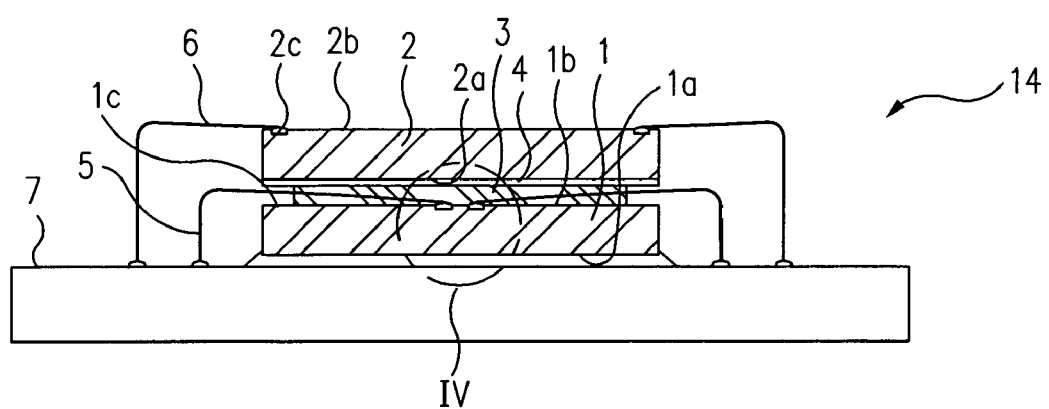
FIG. 4 illustrates a sectional view of another embodiment of the present invention.
Figure 4A:
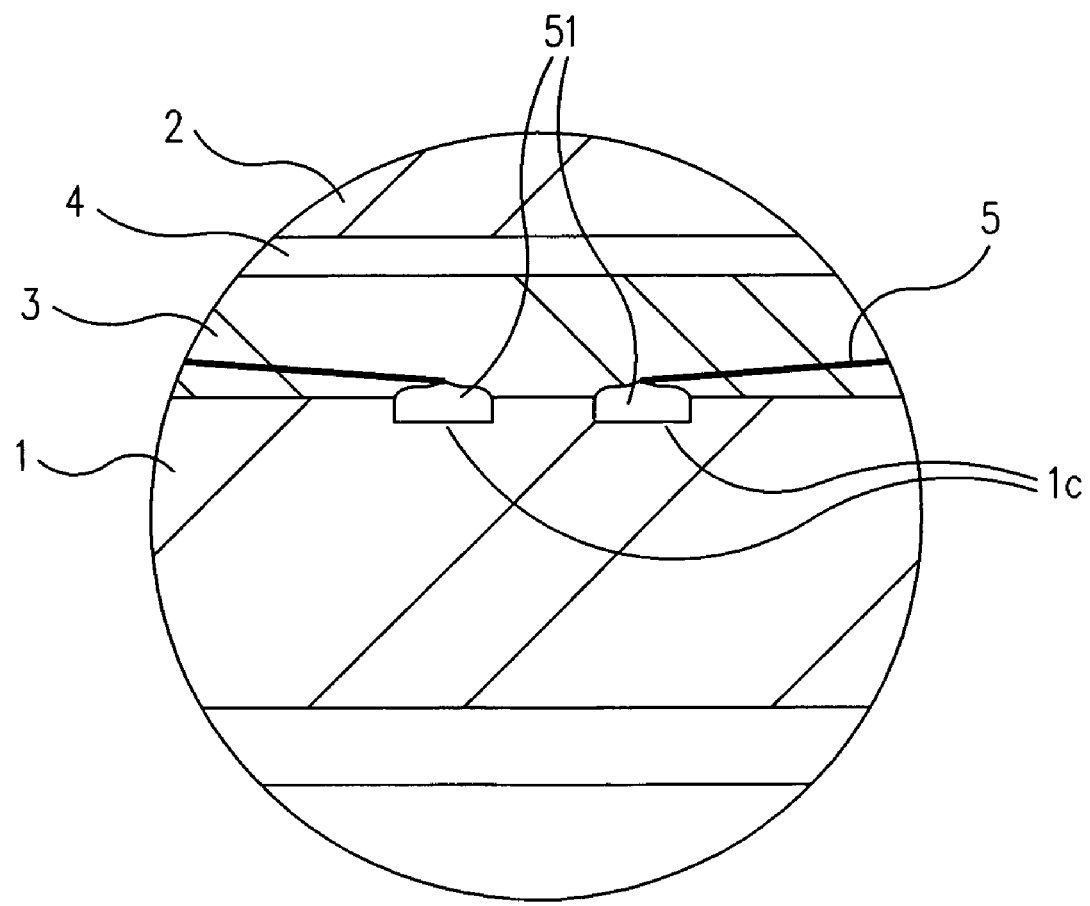
FIG. 4A is a magnified view of circle IV as shown in FIG. 4.

Referring to FIG. 4, a sectional view of another embodiment of the present invention is illustrated. And referring to FIG. 4A, magnified views of circle IV as shown in FIG. 4 is illustrated. Since a stacking structure 14 is constructed in a similar manner to the stacking structure 12 of FIG. 2, only differences existing there between will be described herein below.

As shown in the drawings, there is a center pad type semiconductor chip 1 in which a plurality of input-output pads 1c are formed at the center of the second surface 1b. Also, the input-output pads 1c of the first semiconductor chip 1 and the substrate 7 are bonded to each other by the reverse bonding of the first conductive wires 5.

The reverse bonding manner, as described above, has advantages in that the thickness of the adhesive layer 3 can be thinner. Furthermore, the first conductive wires 5 don't make contact with the region except for the input-output pads 1c of the first semiconductor chip 1 without increasing the loop height.

Here, it is, but not limited to, that a nonconductive liquid phase adhesive is used as the adhesive layer 3. That is, as a certain portion of the first conductive wires 5 is positioned at the inside of the adhesive layer 3, it is desirable to use the nonconductive liquid phase adhesive rather than solid phase adhesive tape. In other words, the input-output pads 1c of the first semiconductor chip 1 and the substrate 7 is bonded to each other by the reverse bonding of the first conductive wires 5. Of course, conductive balls 51 are formed on the input-output pads 1c of the semiconductor chip 1 by the conductive wire in advance in order to alleviate an impulse created by the stitch bonding.

The nonconductive liquid phase adhesive is applied to the first surface 1a of the first semiconductor chip 1 and is hardened. Then, the second semiconductor chip 2, to which the insulator 4 is stuck, is bonded on the adhesive layer 3. The insulator 4 may include such substances as a nonconductive liquid phase adhesive, a nonconductive adhesive tape/film, a polyimide, an oxide layer and a nitride layer or other substances that are commonly known in the art for semiconductor chips or packages, as described above. Again, the listing of the above substances should not be seen as to limit the scope of the present invention.

Further, a wedge bonding can be applied to the first and the second conductive wires 5 and 6 in order to lower the loop height. That is, the wedge bonding is constructed in such a manner that an end of the conductive wire is bonded on the substrate by stitch bonding. Then, the other end of the conductive wire is bonded on the input-output pad of the semiconductor chip by stitch bonding.

Also, in the FIG. 4, the input-output pads 2c of the second semiconductor chip 2 are bonded to substrate 7 by the reverse bonding of conductive wires 6. However, the normal bonding manner is also possible. Furthermore, the second semiconductor chip 2 of the edge pad type is illustrated in FIG. 4. However, the center pad type is also possible. In this case, the second conductive wires 6 are generally bonded to substrate 7 by the reverse bonding or wedge bonding.

Meanwhile, the stacking structures according to the present invention are described on the basis of the first and the second semiconductor chips 1 and 2. However, a plurality of semiconductor chips (for example, a third semiconductor chip, a fourth semiconductor chip, etc.) may be stacked one up on another. It will be appreciated by those persons skilled in the art that such an arrangement is optional. In other words, the present invention is not limited by a number of the stacked semiconductor chips.

Figure 5:
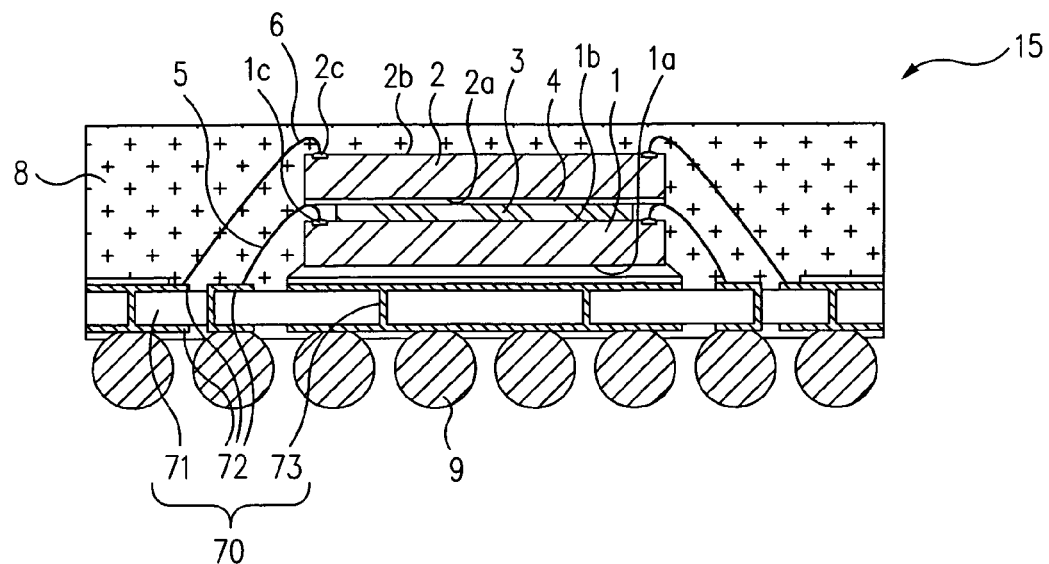
FIG. 5 illustrates a sectional view of another embodiment of the present invention.

Referring to FIG. 5, a sectional view of another embodiment of the present invention is illustrated. The stacking structure of the semiconductor chip is identical with that of FIG. 1. As shown in the FIG. 5, a substrate 70 having a substantially plate form is provided. The substrate 70 includes resin layer 71, a plurality of circuit patterns 72 formed at a top and bottom of the resin layer 71 and a plurality of conductive via 73 connecting the top and bottom circuit patterns 72. The substrate 70, as is generally known, may be a printed circuit board, circuit tape or circuit film. The listing of the substrates 70 should not be seen as to limit the scope of the present invention.

A first semiconductor chip 1 is bonded on a surface of the substrate 70. The semiconductor chip 1 includes a first surface 1a and a second surface 1b, which are substantially in a flat type. A plurality of input-output pads 1c are formed on the second surface 1b of the first semiconductor chip 1.

The input-output pads 1c of the first semiconductor chip 1 and some top circuit patterns 72 of the substrate 70 are bonded to each other by the first conductive wires 5.

An adhesive layer 3 having a predetermined thickness is bonded on the second surface 1b of the first semiconductor chip 1.

A second semiconductor chip 2 having a first surface 2a and a second surface 2b, which are substantially in a flat type, is positioned on the upper part of the adhesive layer 3. A plurality of input-output pads 2c are formed on the second surface 2b of the second semiconductor chip 2. Further, an insulator 4 is formed on the first surface 2a of the second semiconductor chip 2. The input-output pads 2c of the second semiconductor chip 2 and others top circuit patterns 72 of the substrate 70 are bonded to each other by the second conductive wires 6.

Moreover, the first semiconductor chip 1, the adhesive layer 3, the second semiconductor chip 2, insulator 4, the first and the second conductive wires 5 and 6 are sealed with sealing material, such as an epoxy molding compound. The area sealed with the sealing material is defined as a sealing part 8.

Finally, conductive balls 9 such as solder balls are fused to the bottom circuit patterns of the substrate 70. Such semiconductor package 15 can be mounted to a mother board later.

Figure 6:
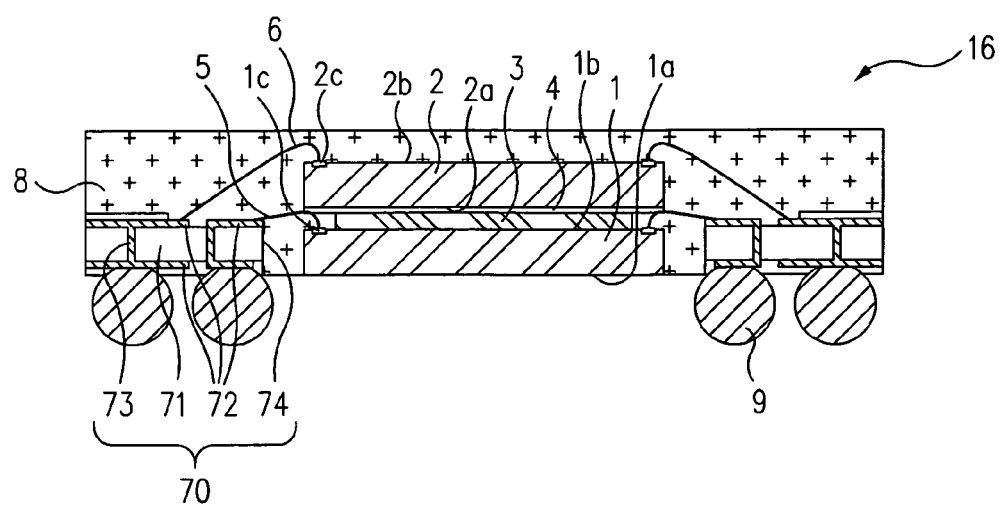
FIG. 6 illustrates a sectional view of another embodiment of the present invention.

Referring to FIG. 6, a sectional view of another embodiment of the present invention is illustrated. The stacking structure of the semiconductor chip is identical with that of FIG. 1. Since the semiconductor package 16 is constructed in a similar manner to the semiconductor package 15 of FIG. 5, only differences existing there between will be described herein below.

As shown in FIG. 6, a perforating hole 74 of which size is larger than that of the semiconductor chip 1 is formed on a center of the substrate 70. A plurality of circuit patterns 72 are formed at the outside of the perforating hole 74. The semiconductor chip 1 is located in the perforating hole 75 so as to form a thinner semiconductor package 15. The input-output pads 1c of the semiconductor chip 1 are bonded to circuit patterns 72 by the first conductive wires 5.

Furthermore, the sealing part 8 is formed inside at the perforating hole 74, and the first surface 1a of the semiconductor chip 1 is exposed outward from the sealing part 8 so as to increase the heat dissipation capability of the first semiconductor chip 1.

Since the semiconductor chip and the substrate is overlapped by each other, the total thickness of the semiconductor package 15 becomes thinner. Furthermore, since the first surface 1a of the semiconductor chip 1 is exposed outward from the sealing part 8, the semiconductor package 15 increases its heat dissipation capability.

Figure 7:
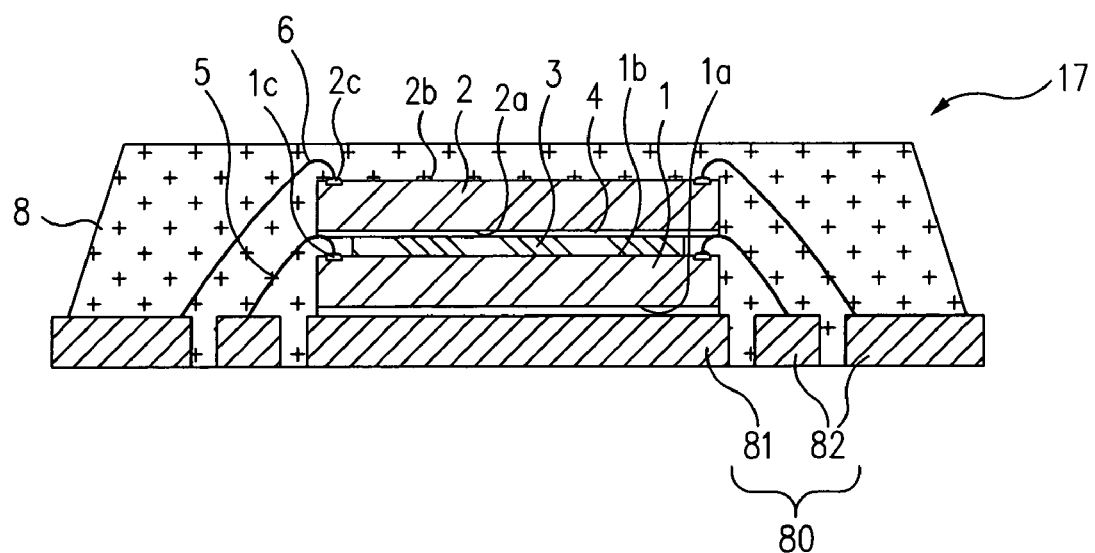
FIG. 7 illustrates a sectional view of another embodiment of the present invention.

Referring to FIG. 7, a sectional view of another embodiment of the present invention is illustrated. A stacking structure of the semiconductor chip is identical with that of FIG. 1. As shown in FIG. 7, a substrate 80 having a substantially plate form is provided. The substrate 80 includes chip mounting plate 81 and a plurality of leads 82 formed at an outside of the chip mounting plate 81. Such a substrate 80, as is generally known, may be a conventional lead frame or a micro lead frame (MLF).

A first semiconductor chip 1 is bonded to the chip mounting plate 81 of the substrate 80. The semiconductor chip 1 includes a first surface 1a and a second surface 1b, which are substantially flat in nature. A plurality of input-output pads 1c are formed on the second surface 1b of the first semiconductor chip 1. The input-output pads 1c of the first semiconductor chip 1 and some leads 82 of the substrate 80 are bonded to each other by the first conductive wires 5.

An adhesive layer 3 having a predetermined thickness is bonded on the second surface 1b of the first semiconductor chip 1.

A second semiconductor chip 2 having a first surface 2a and a second surface 2b, which are substantially flat in nature, is positioned on the upper part of the adhesive layer 3. A plurality of input-output pads 2c are formed on the second surface 2b of the second semiconductor chip 2. An insulator 4 is formed on the first surface 2a of the second semiconductor chip 2.

The input-output pads 2c of the second semiconductor chip 2 and others leads 82 of the substrate 80 are bonded to each other by the second conductive wires 6.

Moreover, the first semiconductor chip 1, the adhesive layer 3, the second semiconductor chip 2, insulator 4, the first and the second conductive wires 5 and 6, and the substrate 80 are sealed with sealing material, such as an epoxy molding compound. The area sealed with the sealing material is defined as a sealing part 8. Here, a bottom surface of the chip mounting plate 81 and plurality of leads 82 are exposed outward from the sealing part 8.

Also, these semiconductor packages 15, 16 and 17 can include the stacking structures illustrated in FIGS. 2, 3 and 4. Furthermore, the stacking structure according to the present invention is described on the basis of the first and the second semiconductor chips 1 and 2. However, a plurality of semiconductor chips (for example, a third semiconductor chip, a fourth semiconductor chip, etc.) may be stacked one up on another. It will be appreciated by those persons skilled in the art that such an arrangement is optional. In other words, the present invention is not limited by the number of the semiconductor chip.

According to the stacking structure of the semiconductor chip and the semiconductor package using it, the insulator is further formed on the first surface of the second semiconductor chip, where it can be electrically insulated while the conductive wire is contacted with the insulator.

Also, the insulator is made from a soft or elastic material, thereby preventing the mechanical damage of the conductive wire. Furthermore, the thickness of the adhesive layer can become thinner adequately in order to diminish a total thickness of the stacked semiconductor chip or package.

Moreover, the conductive wire is stuck to the insulator, thereby having the effect of preventing the leaning phenomenon of the conductive wire during the sealing process and or the like.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of forming a semiconductor package comprising:
   providing a substrate;
   coupling a first semiconductor chip to a surface of the substrate, the first semiconductor chip having first and second surfaces which are substantially flat in nature;
   forming at least one input-output pad on the second surface of the first semiconductor chip;
   coupling at least one first conductive wire from the input-output pad of the first semiconductor chip to the substrate;
   laying an adhesive layer to the second surface of the first semiconductor chip;
   providing a second semiconductor chip having first and second surfaces which are substantially flat in nature; and
   forming an insulator coupled to and covering the entire first surface of the second semiconductor chip, the first conductive wire contacting the insulator, the insulator preventing the first conductive wire from shorting to the first surface of the second semiconductor chip, wherein the second semiconductor chip is coupled to the adhesive layer by the insulator coupled to the first surface thereof.

2. The method of claim 1 further comprising:
   forming at least one input-output pads on the second surface of the second semiconductor chip; and
   connecting at least one second conductive wire from the input-output pads of the second semiconductor chip to the substrate.

3. The method of claim 1 further comprising:
   providing an edge pad type semiconductor chip as the first semiconductor chip; and
   forming the input-output pad of the first semiconductor chip at an inner circumference of the second surface.

4. The method of claim 1 further comprising:
   ball bonding a first end of the first conductive wire to the substrate; and
   stitch bonding a second end of the first conductive wire to the input-output pad of the first semiconductor chip.

5. The method of claim 4 further comprising forming a conductive ball on the input-output pad of the first semiconductor chip bonded by the stitch bonding.

6. The method of claim 4 further comprising forming a supporter on the first conductive wire connected on the input-output pad so as to support the second semiconductor chip.

7. The method of claim 1 further comprising:
   providing a center pad type semiconductor chip as the first semiconductor chip; and
   forming the input-output pad at a center of the second surface thereof.

8. The method of claim 1 further comprising:
   bonding a first end of the first conductive wire to the substrate; and
   stitch bonding a second end of the first conductive wire to the input-output pad of the first semiconductor chip.

9. The method of claim 7 further comprising:
   bonding a first end of the first conductive wire to the substrate; and
   stitch bonding a second end of the first conductive wire to the input-output pad of the first semiconductor chip.

10. A method of forming a semiconductor package comprising:
    coupling a first surface of a first semiconductor chip to a substrate, the first semiconductor chip further comprising a second surface comprising a plurality of pads;
    coupling an adhesive layer to the second surface of the first semiconductor chip;
    covering an entire first surface of a second semiconductor chip with an insulator; and
    attaching the insulator to the adhesive layer, wherein the insulator is directly vertically between the first surface of the second semiconductor chip and each of the pads of the second surface of the first semiconductor chip.

11. The method of claim 10 further comprising connecting the pads of the second surface of the first semiconductor chip with the substrate with first conductive wires.

12. The method of claim 11 wherein the first conductive wires contact the insulator.

13. The method of claim 12 wherein the insulator prevents damage to the first conductive wires.

14. The method of claim 12 wherein the insulator prevents shorting of the first conductive wires.

15. The method of claim 10 further comprising:
    covering the first and second semiconductor chips with a sealing material, wherein a portion of the sealing material is vertically between the second surface of the first semiconductor chip and the insulator.

16. The method of claim 10 wherein the adhesive layer is attached to the second surface of the first semiconductor chip entirely inward of the pads of the second surface of the first semiconductor chip.

17. The method of claim 10 wherein the second semiconductor chip further comprising a second surface comprising a plurality of pads, the method further comprising connecting the pads of the second surface of the second semiconductor chip with the substrate with second conductive wires.

18. The method of claim 10 further comprising:
   forming conductive balls on the pads of the second surface of the first semiconductor chip;
   bonding first conductive wires to the conductive balls, the first conductive wires connecting the pads of the second surface of the first semiconductor chip with the substrate; and
   forming supporters on the first conductive wires, wherein the supporters contact the insulator to support the second semiconductor chip.

19. A method of forming a semiconductor package comprising:
   coupling a first surface of a first semiconductor chip to a substrate, the first semiconductor chip further comprising a second surface comprising a plurality of pads;
   connecting the pads of the second surface of the first semiconductor chip with the substrate with first conductive wires;
   coupling an adhesive layer to the second surface of the first semiconductor chip entirely inward of the pads of the second surface of the first semiconductor chip;
   covering an entire first surface of a second semiconductor chip with an insulator, the second semiconductor chip comprising a second surface comprising a plurality of pads;
   attaching the insulator to the adhesive layer, wherein the insulator is directly vertically between the first surface of the second semiconductor chip and each of the pads of the second surface of the first semiconductor chip and contacts the first conductive wires;
   connecting the pads of the second surface of the second semiconductor chip with the substrate with second conductive wires; and
   covering the first and second semiconductor chips with a sealing material, wherein a portion of the sealing material is vertically between the second surface of the first semiconductor chip and the insulator.

* * * * *